United States Patent
Martinez et al.

(10) Patent No.: US 11,340,583 B2
(45) Date of Patent: May 24, 2022

(54) DATA PROCESSING DEVICE FOR GENERATING MICROSTRUCTURES WITH ORTHOTROPIC ELASTIC PROPERTIES

(71) Applicant: INRIA INSTITUT NATIONAL DE RECHERCHE EN INFORMATIQUE ET EN AUTOMATIQUE, Le Chesnay (FR)

(72) Inventors: Jonas Martinez, Nancy (FR); Sylvain Lefebvre, Velaine en Haye (FR); Jérémie Dumas, Fuveau (FR); Haichuan Song, Liaoning (CN)

(73) Assignee: INRIA INSTITUT NATIONAL DE RECHERECHE EN INFORMAT, Le Chesnay (FR)

( * ) Notice: Subject to any disclaimer, the term of this patent is extended or adjusted under 35 U.S.C. 154(b) by 128 days.

(21) Appl. No.: 16/616,264

(22) PCT Filed: May 23, 2018

(86) PCT No.: PCT/FR2018/051225
§ 371 (c)(1),
(2) Date: Nov. 22, 2019

(87) PCT Pub. No.: WO2018/220313
PCT Pub. Date: Dec. 6, 2018

(65) Prior Publication Data
US 2020/0089195 A1    Mar. 19, 2020

(30) Foreign Application Priority Data

Jun. 1, 2017  (FR) ........................................ 1754866

(51) Int. Cl.
G05B 19/4093    (2006.01)
B33Y 10/00    (2015.01)
(Continued)

(52) U.S. Cl.
CPC ...... *G05B 19/40932* (2013.01); *B29C 64/393* (2017.08); *B33Y 10/00* (2014.12);
(Continued)

(58) Field of Classification Search
CPC ......... B33Y 10/00; B33Y 50/02; G06F 30/00; G06T 17/20; B29C 64/393; B29C 64/386;
(Continued)

(56) References Cited

U.S. PATENT DOCUMENTS

2014/0324204 A1* 10/2014 Vidimce ............... B29C 64/386
700/98

FOREIGN PATENT DOCUMENTS

FR    3038254 A1    1/2014
FR    3038254 A1 *  1/2017  ............. B33Y 50/02

OTHER PUBLICATIONS

Sommerfeld, R. A., A Branch Grain Theory of Temperature Gradient Metamorphism in Snow, A Branch Grain Theory of Temperature Gradient Metamorphism in Snow, Journal of Geophysical Research: Oceans, vol. 88, Issue C2, p. 1484-1494 (Year: 1983).*

(Continued)

*Primary Examiner* — Thomas C Lee
*Assistant Examiner* — Syed A Warsi
(74) *Attorney, Agent, or Firm* — Maynard, Cooper & Gale, P.C.; Brian Sattizahn

(57) ABSTRACT

The invention relates to a device designed to determine manufacturing data for producing objects that have variable, freely orientable orthotropic elasticity characteristics, by calculating data relating to grains of branches, which combined define branches, the number of grains of branches and the thickness of each branch being related to the desired elasticity characteristics.

14 Claims, 4 Drawing Sheets

Figure 1:
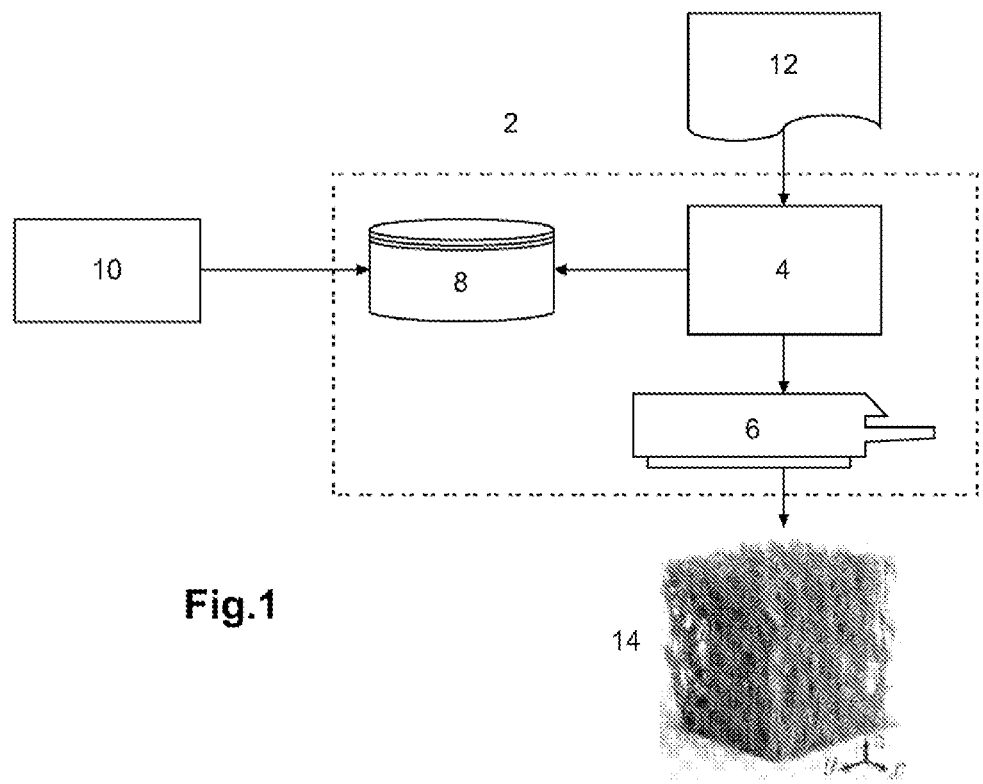

(51) Int. Cl.
  *B33Y 50/02* (2015.01)
  *B29C 64/393* (2017.01)
  *G06F 30/00* (2020.01)
  *G06T 17/20* (2006.01)

(52) U.S. Cl.
  CPC .............. *B33Y 50/02* (2014.12); *G06F 30/00* (2020.01); *G06T 17/20* (2013.01); *G05B 2219/49023* (2013.01)

(58) Field of Classification Search
  CPC .... G05B 2219/49023; G05B 19/40932; Y02P 90/02
  See application file for complete search history.

(56) References Cited

OTHER PUBLICATIONS

Kry, P. R., Quantitative stereological analysis of grain bonds in snow, J. Glaciol., 4(72), 467-77 (Year: 1975).*

Gubler, H., Determination of the mean number of bonds per snow grain and of the dependence of the tensile strength of snow on stereological parameters, J. Glaciol., 20(83), 329-341 (Year: 1978).*

* cited by examiner

DATA PROCESSING DEVICE FOR GENERATING MICROSTRUCTURES WITH ORTHOTROPIC ELASTIC PROPERTIES

The invention relates to the field of objects exhibiting orthotropic elastic properties and in particular the manufacturing of these objects by additive manufacturing or other.

Many works have touched on the generation of structures that make it possible to obtain objects exhibiting a variable elasticity. These works use the principle of an application of a small-scale pattern (microstructure), the large-scale study of which makes it possible to validate the structural features. Thus, an object exhibiting a variable elasticity can be manufactured by producing several sub-objects based on different patterns.

However, this type of approach is complex to implement in the context of additive manufacturing because the latter imposes strong technology-dependent manufacturing constraints (vertical continuity in the case of layered deposition, or absence of pocket in the case of the use of powders). Furthermore, this kind of technique generates computer objects (meshings or volumes) that are extremely voluminous, and which poses problems with the current additive manufacturing machines.

The Applicant has proposed, in the French patent application FR1652497, a manufacturing device based on the generation of isotropic Voronoï foams that make it possible to obtain a wide range of elasticity and to vary this elasticity progressively within the volume of a part. However, this approach cannot produce an elasticity which, at a given point, is different according to the direction of the loads: the elasticity is necessarily isotropic, that is to say the same whatever the direction of the loads at a local point. It is not therefore possible to produce an object whose elasticity can be modulated according to certain directions, for example a cube which is more rigid vertically than in the horizontal plane.

These problems arise also when seeking to machine these objects by other methods, whether by molding or by extrusion.

The invention improves this situation. To this end, the invention proposes a data processing device for manufacturing foam, comprising a memory arranged to receive location data designating a location and a volume element containing this location, and a generator arranged to determine additive manufacturing data indicating if a location associated with the location data is empty or full. The memory is arranged to receive density data, deformation data and radius data.

The generator is arranged to calculate, for a given location designated by location data, branch grain data designating locations of branch grains of a set of branch grains associated with the given location, to determine said branch grain locations in a plurality of volume elements comprising the volume element containing the given location on the one hand and volume data selected in a vicinity of the volume element containing the given location on the other hand, each volume element receiving a number of branch grains drawn from density data associated with this volume element, to calculate a measurement between a first branch grain and a second branch grain from the distance between the location of the first branch grain on the one hand and the second branch grain on the other hand, by weighting this distance as a function of deformation data associated with the first branch grain and with the second branch grain, to select at least two branch grains for each branch grain, such that these at least two branch grains are the closest neighbors according to the measurement calculated by the generator (4, 10), and to define manufacturing data indicating that a location is full when the distance between said location and its projection on one of the branches linking each branch grain to its closest neighbors is less than a distance drawn from the radius data.

In other embodiments, the device will be able to have one or more of the following additional features:

the generator is also arranged to calculate the measurement between a first branch grain and a second branch grain by weighting it as a function of a frame of reference associated with the deformation data, the generator is arranged to select the closest neighbors of a given branch grain from among a subset of branch grains which excludes the branch grains whose locations are situated at a distance from the location of the given branch grain greater than a threshold drawn from the deformation data and from the number of closest neighbors sought, the generator is arranged to allocate the branch grains in a deterministic manner within each volume element, the generator is arranged to determine said branch grain locations by dividing each volume element of the plurality of volume elements into one or more volume sub-elements, the number of which is calculated from the density data and from the volume of each volume element, by pseudo-randomly determining, as a function of the location data and of the density data, volume sub-elements receiving a branch grain, and by pseudo-randomly determining, in each volume sub-element receiving a branch grain, branch grain data designating a location in this volume sub-element, the generator is a modeler arranged to receive a triplet associating density data, deformation data and radius data, to determine a set of additive manufacturing data for an object of substantially cubic form from this pair, and to apply a homogenization method to draw a tensor datum therefrom, the modeler is arranged, for a given triplet, to determine several sets of additive manufacturing data by varying the pseudo-random determinations, and to produce an average of the tensor data for the given triplet, and the generator is a constructor arranged to receive object data defining the form of an object to be produced by additive manufacturing and comprising tensor data associated with locations designated by the object data, and, for at least some of the locations of the object data, to determine deformation data, frame-of-reference data, radius data and density data from the associated tensor data, and to determine corresponding additive manufacturing data.

The invention relates also to a method for manufacturing an orthotropic foam which comprises the following operations:

receiving object data associating location data and tensor data, the tensor data being associated with density data, radius data and deformation data, determining branch grain locations in a plurality of volume elements, the number of branch grains in a given volume element being determined from the density data associated with the locations of the given volume element, for each branch grain, calculating a plurality of measurements between this branch grain as first branch grain on the one hand and a second branch grain on the other hand, the second branch grain being chosen for each measurement from among the other branch grains, the measurement being calculated from the distance between the location of the first branch grain on the one hand and the second branch grain on the other hand, by weighting this distance as a function of deformation data associated with the first branch grain and with the second branch grain, selecting at least two branch grains for each branch grain, such that these at least two branch grains are the closest neighbors in the plurality of measurements calculated for each grain, and defining manufacturing data indicating that a given location is full when the distance between said given location and its projection on one of the branches linking each grain to its closest neighbors is less than a distance drawn from radius data, and manufacturing a foam according to the defined full locations.

In miscellaneous variants, the method can have one or more of the following features:

the measurement between a first branch grain and a second branch grain is weighted as a function of a frame of reference associated with the deformation data, to select the closest neighbors of a given branch grain, the plurality of measurements is calculated with a subset of branch grains which excludes the branch grains whose locations are situated at a distance from the location of the given branch grain greater than a threshold drawn from the deformation data and from the number of closest neighbors sought, said branch grain locations are determined deterministically, said branch grain locations are determined by dividing each volume element of the plurality of volume elements into one or more volume sub-elements, the number of which is calculated from the density data and from the volume of each volume element, by pseudo-randomly determining, as a function of the location data and of the density data, volume sub-elements receiving a branch grain, and by pseudo-randomly determining, in each volume sub-element receiving a branch grain, branch grain data designating a location in this volume sub-element, and the foam manufacturing operation is performed by additive manufacturing.

Figure 2:
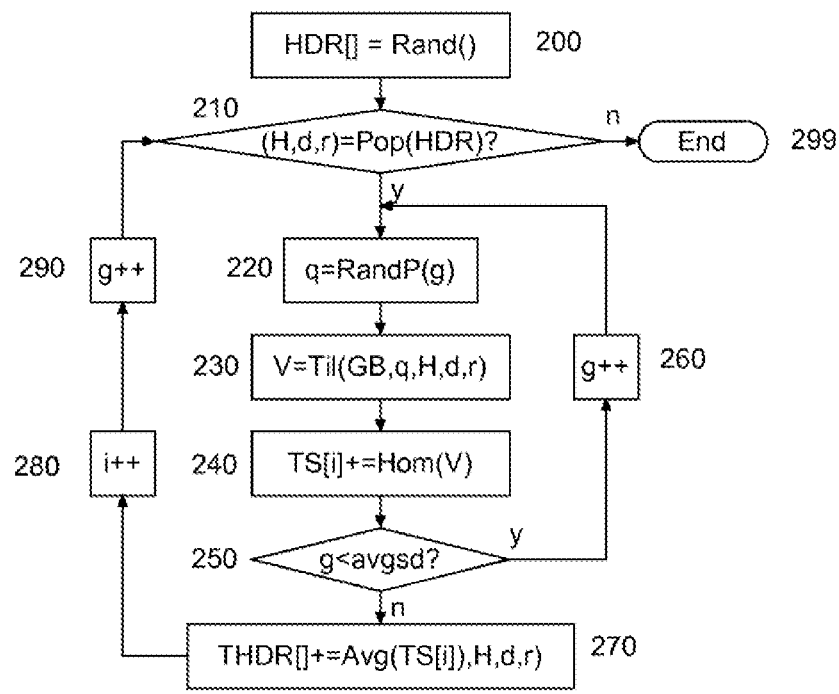
Figure 3:
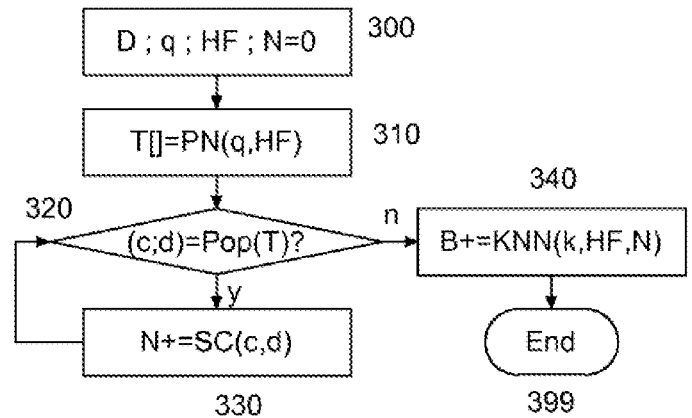
Figure 4:
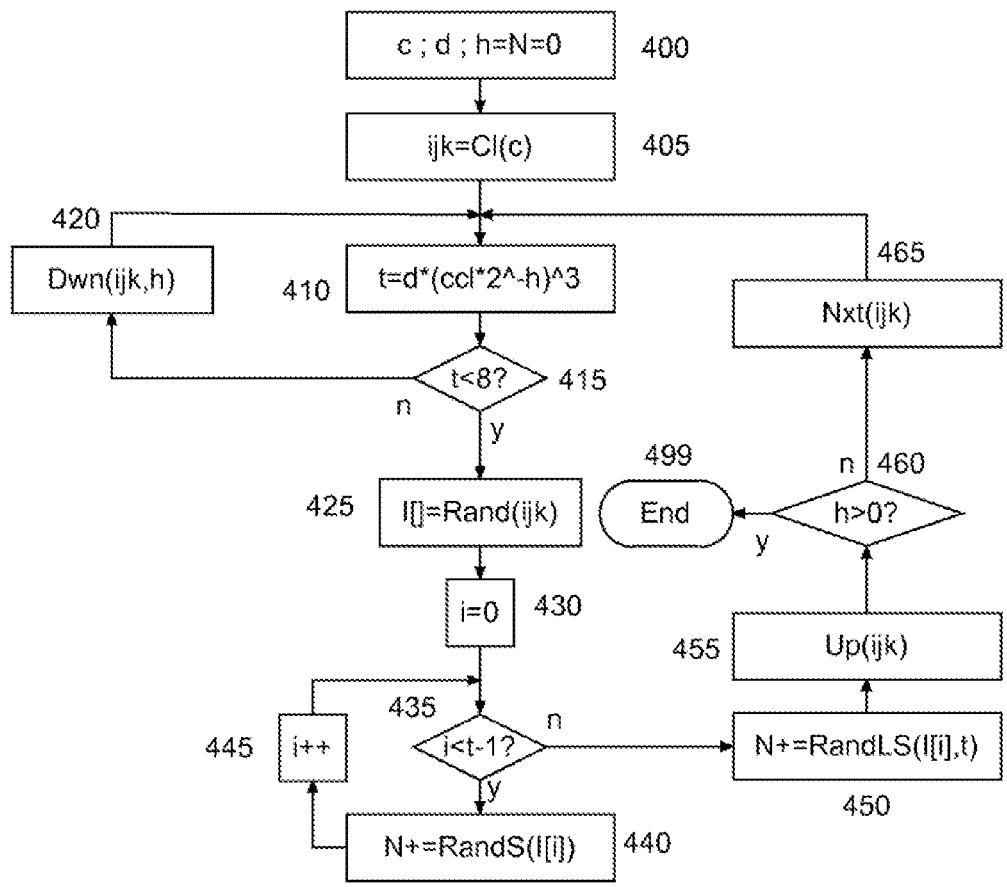
Figure 5:
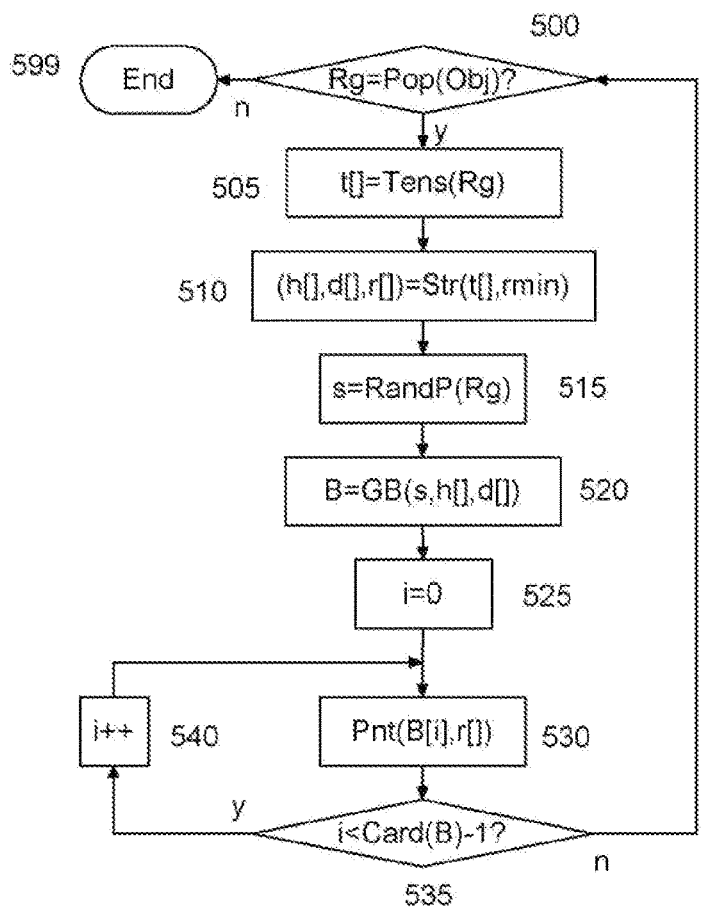
Figure 6:
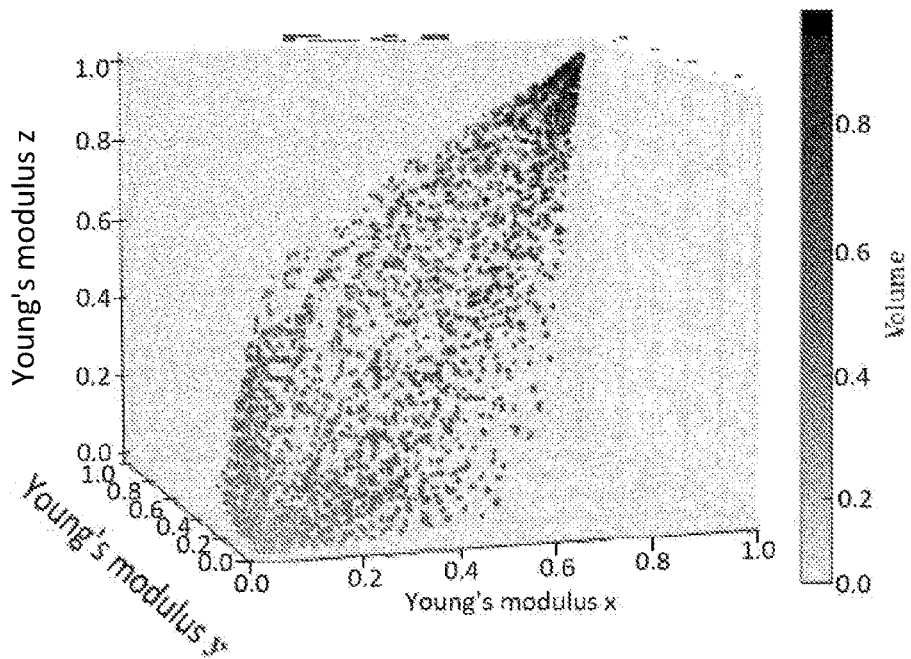
Figure 7:
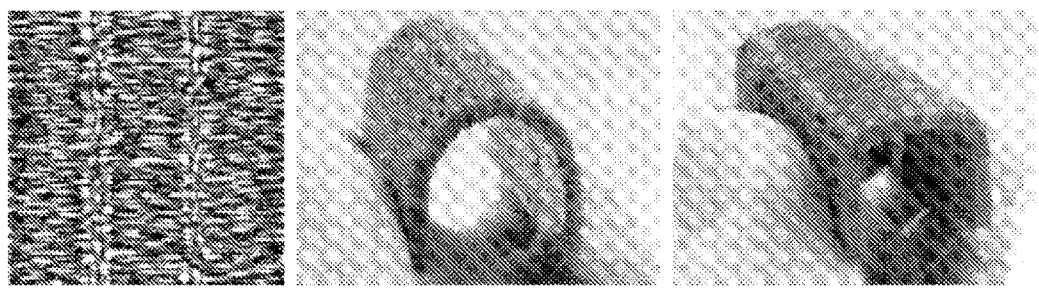

Other features and advantages of the invention will become more apparent on reading the following description, drawn from examples given illustratively and in a non-limiting manner, drawn from the drawings in which:

FIG. 1 represents a schematic diagram of a device according to the invention, FIG. 2 represents an example of implementation of a function by the modeler of FIG. 1, FIG. 3 represents an example of a function implemented by the modeler and the constructor of FIG. 1 to calculate branch grains, FIG. 4 represents an example of a function implemented in the function of FIG. 3, FIG. 5 represents a function implemented by the device of FIG. 1 to print an object, FIG. 6 represents an example of a graph of elasticities obtained in the context of the invention, and FIG. 7 represents an example of an object manufactured by the device of the invention, under various constraints.

The drawings and the description hereinbelow contain, for the most part, elements of a certain nature. They will therefore not only be able to be used to give a better understanding of the present invention, but also to contribute to the definition thereof, where appropriate.

The present description by its nature involves elements liable to protection by royalty and/or copyright. The holder of the rights has no objection to the unaltered reproduction by any of the present patent document or of its description, as it appears in the official files. As for the rest, it reserves all its rights.

FIG. 1 represents a device 2 according to the the invention in its environment. The device 2 comprises a constructor 4, a printer 6 and a memory 8. In the example described here, the device 2 also comprises a modeler 10, the operation of which will be described hereinbelow.

In the context of the invention, the memory 8 can be any type of data storage designed to receive digital data: hard disk, flash memory hard disk (SSD), flash memory in any form, random-access memory, magnetic disk, locally-distributed or Cloud storage, etc. The data calculated by the device can be stored on any type of memory similar to the memory 8, or on that memory. This data can be deleted after the device has performed its tasks or it can be retained.

The data stored in the memory 8 comprise n-uplets which associate an orthotropic tensor, deformation data, a density and a radius. In the example described here, these n-uplets are calculated by the modeler 10. As a variant, they could be obtained differently. In the example described here, the orthotropic tensors associated a reference frame defining two or three axes, elasticity values according to each axis of the reference frame, and, optionally, one or two Poisson's ratios. In the example described here, the deformation data comprise as many values as the orthotropic tensors comprise axes. As will be seen below, the deformation data, the density and the radius make it possible to produce a foam having the orthotropic properties of the orthotropic tensor of the n-uplet with which this data set is associated. The data stored in the memory 8 could also be arranged in a form other than triplets or n-uplets.

The constructor 4 and the modeler 10 are elements directly or indirectly accessing the memory 8. They can be produced in the form of an appropriate computer code executed on one or more processors. Processors should be understood to mean any processor suited to the calculations described below. Such a processor can be produced, as is known, in the form of a microprocessor for personal computer, of a dedicated chip of FPGA or SoC ("system on chip") type, of a grid computation resource, of a microcontroller, or of any other form designed to provide the computation power necessary to the implementation described below. One or more of these elements can also be produced in the form of custom electronic circuits such as an ASIC. A combination of processor and of electronic circuits can also be envisaged.

The device 2 receives object data 12. The object data 12 comprises a description of the three-dimensional form which is desired for the object to be printed, and an indication of orthotropy in the form of a field of orthotropy tensors varying within the object, continuously or discontinuously.

From the object data 12, the constructor 4 accesses the memory 8 and determines an n-uplet for each distinct part of the object. Then, from the three-dimensional form sought and from the data obtained, the constructor 4 determines the locations of each layer that has to be printed and commands the printer 6 to produce at the output an object 14 which exhibits elasticity features and the three-dimensional form dictated by the object data 12. The constructor 4 can also determine all of the object 14 by parallelizing the calculations for each distinct part, and print the object 14 according to various methods. The generation of the foam internal to the object can therefore be procedural or not, that is to say that the geometry of the foam can be fully pre-calculated, or else generated on the fly during the printing process (procedural), thus greatly limiting the quantity of memory necessary to store the part.

The objects produced by means of the device 2 can be qualified as "orthotropic foams". Indeed, the invention was designed with a view to producing objects whose elastic behavior is orthotropic—which includes and generalizes isotropy.

For that, the constructor 4 determines, for each layer of the object, branch grains, the quantity of which is dictated by the density of the triplet drawn from the memory 8 from the object data 12 for the portion of the object currently being printed.

Next, the grains of the portion considered are covered in order to link each grain to its k closest neighbor grains, the proximity being drawn from the field of measurements defined from the vectors of local deformations. The distance used for the proximity calculation is therefore biased by the deformation data, which gives rise to the orthotropic elastic behavior. Finally, each point of this portion that can be printed is considered as full if it is situated at a chosen distance from the branches, and empty otherwise, the chosen distance corresponding to the radius of the triplet drawn from the memory 8 from the object data 12. The notion of distance should here be interpreted in the broad sense, it is therefore possible to modify the distance in order to modify the geometry of the edges of the orthotropic foam. Thus, the constructor 4 step-by-step constructs branches which each have a thickness chosen to confer on the structure a chosen elasticity.

FIG. 2 represents an example of a function implemented by the modeler 10 to establish the elasticity, density and radius of value triplets. For that, the modeler 10 generates a large quantity of cubes of orthotropic foams for a large number of density-radius-deformation vector triplets, and determines, by a homogenization method, an elasticity value associated with each triplet. With no loss of generality, and advantageously for the performance levels, the deformation vectors can be provided such that at least one of the values of each vector is set at 1. In order not to have to explore all the possible orientations, the foams produced in this analysis phase have an orthotropy aligned with the axes of each cube.

The modeler 10 thus begins in an operation 200 by executing a function Rand( ), and stores the result in a table HDR[ ]. The object of the function Rand( ) is to generate a very large number of density-radius-deformation vector triplets, in order to be able to offer a wide variety in the construction of the orthotropic foams which will be produced and analyzed subsequently. This function also initializes an index i at 1, an index g at 0, and a table TS[ ] at 0.

Then, the modeler 10 executes a double loop. This double loop covers the triplets of the table HDR[ ], and, for each triplet, performs a loop in which a given triplet is used a large number of times to produce a test orthotropic foam and to draw therefrom corresponding orthotropic elasticity values. When the deformation vector H contains three values, the orthotropic elasticity values comprise three moduli of elasticity, two Poisson's ratios and two shear factors. When the deformation vector H contains two values, the orthotropic elasticity values comprise two moduli of elasticity, one Poisson's ratio and one shear factor. In this case, the orthotropy is expressed only according to two dimensions, that is to say that the foam will be homogeneous according to one of the three dimensions. In the following example, the deformation vector H comprises three values (hx,hy,hz).

The double loop therefore begins with an operation 210 in which a function Pop( ) takes out a triplet of table HDR[ ]. Next, the second loop begins in an operation 220 with the execution of a function RandP( ). The function RandP( ) receives the index g as argument and returns a point q chosen randomly as a function of g in a hypercube (radius, density and deformation vector: 5 dimensions). This function is used to generate variety in the orthotropic foams of the second loop. Indeed, the function RandP( ) produces distinct points of departure which will generate different branch grains, which ensures the reliability of the average produced in the second loop.

Then, in an operation 230, a function Til( ) is executed which receives as arguments a pointer to a function GB( ) the point q, the current triplet (d,r,H), and the index g. The role of the function GB( ) is to generate a set of N branch grains which will define, with the radius r, the orthotropic foam of the current instance of the second loop. FIG. 3 represents an example of implementation of the function GB( ) and will be described later.

The function Til( ) generates an orthotropic foam by starting from object data describing a cubic block which is of sufficient dimension (approximately 3 cm$^3$ in the example described here) to apply a homogenization method (see "*Shape optimization by the homogenization method*" by Allaire, G. 2012, vol. 146. Springer Science & Business Media), and for which the field of tensors is uniform, such that the elasticity is the same throughout the structure. Thus, the homogenization method measures the orthotropic elasticity of an equivalent homogeneous cubic block, for the current triplet (d,r,H). This makes it possible to associate an orthotropic elasticity tensor with each vector.

In the example described here, the function Til( ) generates the cube of foam in a single block, by generating all the branch grains in a single execution of the function GB( ) As a variant, the function Til( ) can parallelize the production of the branch gains by cutting the cube into a plurality of sub-cubes and by executing the function GB( ) on each sub-cube. That is made possible by the fact that the function which defines the branch grains from the point q of departure is deterministic.

Next, the branch grains generated by the function GB( ) and the radius r are then used to determine whether each point of the cube is full or empty, as will be described with FIG. 5. Once all the points p of the cube have been processed, the result thereof is a foam V.

In an operation 240, a function Hom( ) is then executed in order to determine the elasticity value E of the orthotropic foam V received as argument. The elasticity of the foam V is calculated by evaluating the homogenized elasticity tensor. The procedure is globally similar to that described for isotropy in "*Procedural Voronoi foams for Additive Manufacturing*", Martinez et al. 2016, ACM TOG, 35, 4). A significant difference is that the tensor to be extracted is orthotropic: once the homogenized tensor has been obtained, the parameters of the ideal orthotropic tensor are extracted by a minimization of the Euclidian logarithmic distance between the ideal tensor and the homogenized tensor, by forcing the orthotropic tensor to remain defined as positive. Other methods are possible as a variant.

This result is stored in the table TS[ ] with the index i. The table TS[ ] thus receives the list of the elasticities determined for all the foams associated with a given triplet (d,r,H) for a given index i of execution of the first loop.

In order to determine if all the second loops have been explored, the index g is compared to a threshold avgsd in an operation 250. If g is lower, then the second loop is repeated again for the same first loop index i, with incrementation of the index g in the operation 260.

If not, then the first loop is terminated for the index i, with the execution of a function Avg( ) in an operation 270. The function Avg( ) receives as arguments the list of the elasticities TS[i], as well as the density d and the radius r. The function Avg( ) determines the average elasticity of the foams which have been produced on the basis of all the second loops for the index i. The result thereof is an n-uplet associating orthotropic tensor and the radius-density-deformation vector triplet, which is stored in a matrix THDR[ ]. In order to determine an accurate measurement, it can be advantageous to also calculate the standard deviation of the parameters of the elasticity tensors for a given index i.

Finally, the first loop index i is incremented in an operation 280, the index g is reset to 0 in an operation 290, and the first loop resumes with the operation 210.

When the operation 210 determines that all the triplets (d,r,H) of the table DR[ ] have been processed, the function is terminated in an operation 299.

FIG. 3 will now be described in order to better understand the function GB( ) of the operation 230.

As will be seen with FIG. 5, the orthotropic foam is constructed by linking to one another the branch grains which have been generated with a density which depends on the object data 12. The role of the function GB( ) is therefore, for a given location and given object data, to generate corresponding branch grains, and to determine which of these branch grains are linked to one another.

As will be seen below, each branch grain will be linked to its closest neighbors, according to a distance which takes account of the values of the deformation vectors. Indeed, the Applicant has discovered that, by choosing the k closest neighbors according to the field drawn from the deformation vectors associated with the orthotropic tensors via the n-uplets, and by manufacturing a foam from branches linking these k closest neighbors, the resulting foam has orthotropic properties corresponding to the desired orthotropic tensors.

In a preferred variant, the function GB( ) uses an implicit three-dimensional grid having at least one grain in each cell. Only the cells close to the cell comprising the given location are potentially relevant. The number of cells to be examined is calculated from the values hx, hy, hz of the deformation vector associated with a given cell. An implicit grid is understood to mean a cubic pre-subdivision into cells of fixed dimension of the space, which, in the the example described here, has a dimension lying between 2 mm and 5 mm, and is defined implicitly, that is to say that only the index of a cell is retained, and that all the data relating thereto are calculated on the fly. As a variant, the space could be subdivided differently (e.g. rhombus grid, honeycomb grid), and/or with different dimensions, and/or with an explicit definition. The grains could also be generated without underlying grid, by any other process generating a random isotropic distribution of points, such as a point distribution algorithm of centroid Voronoi tessellation type, or else a Poisson disk distribution (for example, a "dart throwing" algorithm). In the case where a parallelization is desired, this distribution should be of deterministic nature.

The function GB( ) commences in an operation 300 with the reception of a field of densities D, of a field of deformation vectors H and of a location q as arguments, and with the initialization to 0 of a vector N. The field of densities D and the field of deformation vectors HF represent the density values d and the deformation vectors H which are associated with each location of the space associated with the location q which is processed by the function GB( ).

In the example of the operation 230, the field of densities D and the field of deformation vectors HF are respectively a density value d and a deformation vector H chosen to produce the cube of foam in the operation 210. As will be seen, the location q plays an important role in the random factors in the production of the branch cell grains by the function GB( ) and the variation of g therefore makes it possible to generate highly variable orthotropic foams for a fixed density d.

After the initialization, a function PN( ) is executed in an operation 310. The function PN( ) receives q as argument, and determines all the cells which surround the cell comprising the location q and which are likely to contain a branch grain which could be one of the k closest neighbors of the grain of the cell containing q. For that, the function PN( ) begins by enlarging the space associated with the location q on which the function GB( ) works as a function of the deformation vector field data HF.

Indeed, the aim of the function GB( ) is to determine branch grain locations for the space covered by the function GB( ) from the location q, and to determine, for each of the branch grains, its closest neighbors, according to a distance which is biased by the deformation vector. That means that a closer neighbor of a given grain could be located outside of the initial work space of the function GB( ) and that this space must be "enlarged" to include all the locations which are likely to contain a branch grain which is a closer neighbor.

Thus, if the space on which the function GB( ) works is defined by two cube corners cmin and cmax, the function PN( ) will return a space [cmin+L; cmax+L] in which L is the maximum value at which a closest grain can be found, and is induced by the maximum value of all the values of the deformation vectors H of the field of deformation vectors HF.

Thus, the function PN( ) returns a table T[ ] which comprises pairs each associating a cell index of the enlarged space in which branch grains must be generated, and the density which is associated with the locations of this cell.

Then, a first loop is launched in order to determine, for each pair of the table T[ ], the location of the branch grains for these cells with their density d. This loop commences in an operation 320 with the extraction of a cell c to be visited in the table T[ ] and of the corresponding density d by means of a function Pop( ) then a function SC( ) is executed in an operation 330 with, as arguments, the density d and the popped cell to determine one or more branch grains for the cell c and the density d. In the case of the operation 230, the density d is set, and will therefore be the same for all the cells. Nevertheless, in other cases, the function PN( ) can return cells whose density is not the same as that of the cell containing the location q.

Next, the first loop resumes with the operation 320, until all the cells of the table T[ ] have been visited to determine the corresponding branch grains, and the latter have been entered into the vector N[ ].

A function KNN( ) is then launched in an operation 340, with, as arguments, a number of neighbors k, the field of deformation vectors HF and the vector N[ ]. The function KNN( ) covers all the branch grains of the vector N[ ] and determines, for each of them, the k branch grains of the vector N[ ] which are the closest to it, according to a distance based on the following formula:

$$d(r,s) = \frac{\sqrt{(r-s)^T M(r)(r-s)} + \sqrt{(s-r)^T M(s)(s-r)}}{2}$$

in which M(r) represents the deformation induced by the deformation vector H of the field of deformation vectors HF at the location of the branch grain r, modified as a function of the orientation of the reference frame of the orthotropic tensor with which it is associated, according to the formula $M(r)=R^T HR$, in which R is the reference frame of the orthotropic tensor with which the deformation vector H is associated. In the case of the operation 230, since the cubes of foam which are generated exhibit an orthotropy aligned with the axes of the cube, M is a matrix with H on its diagonal.

Advantageously, for a given branch grain, the vector N[ ] can be covered to retain only a reduced number of potential neighbors. Indeed, as a function of the deformation vector H associated with the given branch grain, it is possible to determine the minimum envelope within which all the k potential neighbors will necessarily be located. That means that, for this given branch grain, all other branch grains can be ignored, and it is necessary to perform the above distance calculation and the sorting of the k shortest distances only on a restricted number of branch grains.

The works of the Applicant have demonstrated that, for deformation vectors with 3 dimensions, the k neighbors are in practice contained in a sphere centered on the given branch grain and whose radius is $$2 \cdot c * hx^3 \sqrt{k/(\pi * hx * hy * hz)},$$

with c the dimension of a cell and h the greatest value between hx, hy and hz. For deformation vectors with 2 dimensions, the k neighbors are contained in a circle centered on the given branch grain and whose radius is $2 \cdot c * hx \sqrt{k/(\pi * hx * hy)}$, in which c is the size of the cell associated with the given branch grain. A tighter limit could be determined.

On the basis of these distances, the function KNN( ) retains, for each branch grain, the k grains which give the smallest distance. The trials of the Applicant have demonstrated that a number of neighbors k greater than or equal to 2 is sufficient to obtain connected results (that is to say one-piece foam blocks) in most cases, and that an excellent anisometry/connectivity/computation time trade-off is obtained with k equal to 6. In the example described here, the number k is kept constant during the execution of the function GB( ). As a variant, the value of k could vary during the execution of the function GB( ).

The function KNN( ) returns a list B of the grains which have to be linked to one another. This list can be in the form of pairs, or of n-uplets in which the first element designates a central branch grain, and the other members of the n-uplets designate all the branch grains to which the central branch grain must be linked. In the latter case, that amounts to replacing, in the vector N[ ], each branch grain with the n-uplet whose first element is the corresponding branch grain.

Finally, the function GB( ) is terminated with the operation 399.

FIG. 4 represents an exemplary embodiment of the function SC( ). The role of this function, from a cell c and a density that are received as arguments, is to generate the branch grains corresponding to the density sought. For that, the cell c will be divided repeatedly into sub-cells, until the size of the sub-cells is such that each sub-cell contains approximately one grain. It is important to note that different calls to the function SC(d;c) will always generate exactly the same set of grains for one and the same cell c. In other words, the function SC( ) is deterministic for one and the same original location q.

For that, in an operation 400, the cell c and the density d are received as argument, and a depth index h as well as a vector N receiving the branch grains are initialized at 0.

Next, in an operation 405, a function Cl( ) is executed to determine the coordinates of the cell c. This determination is important for the parallelization of the function SC( ) as will be seen later.

The cell c is then divided into sub-cells in a loop involving operations 410, 415 and 420. In the operation 410, a theoretical number of grains t is calculated by multiplying the density d by a constant ccl corresponding to the size of the cells at the highest level, which constant is multiplied by two to the power minus h, this product being cubed. Indeed, in the example described here, since the space is subdivided cubically, each additional depth (when h increases) divides the volume of the cell by eight. In the operation 415, t is compared to 8. Indeed, if t is less than 8, then it is no longer necessary to subdivide the cell into sub-cells, since each sub-cell will have at most one one branch grain. Otherwise, in an operation 420, a function Dwn( ) increases the dimensions ijk in order to subdivide the cell into eight sub-cells, then the operation 410 is repeated.

In the example described here, the cells are cubic and are subdivided identically into sub-cells of identical volume, and all the highest level cells have a volume equal to that of the highest level cell containing the location q. As a variant, the volumes of the cells could vary, the forms of the cells and the sub-cells also, and the number of grains in the sub-cells would then be evaluated accordingly, such that the sum of the number of grains generated in the sub-cells corresponds to the number of grains calculated for their parent cell, since the sub-cells form a partition of the volume thereof.

When the lowest useful depth for the density sought has been reached, a function Rand(ijk) is executed in an operation 425. This function re-enters into a vector I[ ] eight indices in a pseudo-random order, each index designating a sub-cell. Since the function is pseudo-random, the same table I[ ] is produced for one and the same value of ijk.

Next, an index i is initialized at 0 in an operation 430. The index i is used to cover the sub-cells of the vector I[ ] and assign them a branch grain if necessary.

A loop is thus executed, in which an operation 435 determines if enough grains have been generated. Indeed, t will generally be a non-integer value. The index i is therefore compared to t−1. If i is less than t−1, then a branch grain must again be produced in the cell designated by I[i].

For that, a function RandS( ) is executed in an operation 440. This function receives as argument I[i] and pseudo-randomly determines a location in the cell designated by the index I[i], and places it in the vector N such that it occupies the index 0 if it is closer to the location q than the branch grain occupying the index 0.

The random nature of this function depends at least partly on the index of the sub-cell, which means that, each time the function is executed with that index, it is the same branch grain which is generated. And, when the index changes, another random grain is generated, etc. Thus, the function RandP(g) of the operation 220 varies the orthotropic foam patterns produced, since it varies the index of the cell for which the grains are sought by modifying the points q.

The corresponding branch grain is stored in the vector N, then the index i is incremented in an operation 445, then the test of the operation 435 is repeated. When this test is negative, a branch grain must be generated in the next sub-cell, according to a probability corresponding to the decimal part oft.

For that, a function RandLS( ) is executed in an operation 450 and receives as argument I[i] and t. The function RandLS( ) is very similar to the function RandS( ), except that it creates in the remaining sub-cell (that is to say that designated by the index I[i]) only with a probability equal to the decimal part oft (that is to say t minus the integer part of t). If a grain is thus generated, it is also received in the vector N.

Next, in an operation 455, a function Up( ) which receives ijk as argument is executed. This function determines whether the current cell ijk is the last daughter cell of the higher level parent cell, that is to say, in the example described here, whether ijk modulo (2,2,2) has the value (1,1,1). If that is the case, then the eight sub-cells of the higher level parent cell have been processed, and the function decrements the depth index h. The value ijk is then then updated by keeping the integer part of a division by (2,2,2), thus obtaining the index of the higher level parent cell. For example, if the depth h was equal to 3 and the index ijk was equal to (3,7,7), the new index h is equal to 2, and the index ijk is equal to (1,3,3), which corresponds to the parent cell. This new index is itself tested to determine whether the current cell ijk is the last of the given level. The operation is repeated until a cell ijk is determined which is not the last daughter cell of its higher level parent cell, or which is at the highest level. Thus, when the last sub-cell of the deepest level is processed, the function Up( ) returns to the level 0.

Next, a test in an operation 460 determines whether all the cells have been processed (that is to say if h has been decremented to 0). If there are still sub-cells to be covered, a function Nxt( ) which receives ijk as argument is executed in an operation 465, and otherwise the function SC( ) stops in an operation 499. The function Nxt( ) is arranged to organize the covering of the sub-cells having one and the same parent cell. Indeed, since, at each level, a given cell is subdivided into eight sub-cells, the cell ijk of level h is one out of eight sub-cells of its parent cell. The function Nxt( ) adjusts ijk to cover the sub-cells of one and the same parent cell according to an order guaranteeing that all the cells are explored, the last sub-cell visited having an index ijk modulo (2,2,2) equal to (1,1,1). The loop then resumes with the operation 410, to redescend as deep as necessary into the new cell, etc.

This arrangement is particularly advantageous, because it makes it possible to massively parallelize the operations of the function SC( ), for example to execute them on a graphics processor. As a variant, the function SC( ) could be programmed recursively, which is simpler in programming terms, but poses problems for parallelized processing on a GPU or an architecture without data stack on execution.

FIG. 5 represents an example of a function implemented by the constructor 4 to manufacture the object 14 from the object data 12.

The manufacturing is a loop in which the object data 12, which describe the form of the object in three dimensions, and the orthotropy sought for each portion, are progressively popped to construct the object 14.

A first operation is executed to recover all the information relating to a given region. Indeed, since the function SC( ) is deterministic, the branch grains will always be the same for one and the same region of the space.

Consequently, it is possible to subdivide the object into several regions, for example cubes, and to calculate the branches for each cube, in parallel. A procedural approach would also be possible, but would have a much greater computation cost because the calculation of the branches entails determining the k closest neighbors for each branch grain.

Thus, in an operation 500, the object data 12 are popped by a function Pop( ) and stored in a variable Rg. This variable receives all the orthotropic tensor data of a current block to be printed and the orientation data (angles) thereof, thus defining a field of tensors varying in the space.

Next, in an operation 505, a function Tens( ) extracts all the orthotropic tensor data and the orientation data corresponding to the field of tensors and stores them in a vector t[ ].

This function can be a simple copy or comprise a standardization or homogenization operation to take account of a context linked to a particular object.

The vector t[ ] is exploited in an operation 510 by a function Str( ) which receives it as argument, as well as a radius rmin which represents the minimum print radius of the printer 6.

The function Str( ) is important because its result is a field of vectors h[ ], d[ ] and r[ ] which determine the number of branch grains and the thickness of the corresponding branches in the orthotropic foam which will be printed.

For that, the function Str( ) accesses the memory 8 to determine, for each element of the vector t[ ], a triplet associating a radius r, a density d and deformation vector values hx, hy, hz. As has been seen, this triplet has been calculated previously by the modeler 10.

In the example described here, the triplets have been determined by applying the homogenization theory to a replicated orthotropic foam pattern. The homogenization theory has been validated for regular objects, that is to say objects composed only of a single repeated pattern. However, the aim sought is precisely a heterogeneity of elasticity, and therefore the orthotropic foam forming the object 14 will inherently not be a single repeated pattern.

The works of the Applicant have nevertheless shown that the homogeneity hypothesis remained valid in the case of the orthotropic foams, with a correspondence that is all the better as the density is increased, because the foam has a small scale relative to the filled volume. For that reason, the function Str( ) is provided to choose as a priority a triplet in which the radius r is rmin, in order to maximize the density d. FIG. 6 represents an example of a three-dimensional diagram linking all the triplets for a chosen type of additive material, such as a photosensitive resin marketed under the name "B9R-1-Cherry" by the company B9Creators (registered trademark). When a value is not explicitly present, it can be interpolated from the closest present values. The data represented in FIG. 6 can also be approximated by a polynomial, in order to make the data even more implicit. When, for a given elasticity, the radius rmin would require an excessively great density, it is the next realizable thickness after rmin which is retained, etc.

Next, the branches of the orthotropic foam will be generated in order to define, for each point of the region Rg, whether the printer 6 must add material, or not.

In an operation 515, a points is initialized randomly in Rg. Next, in an operation 520, the branch grains of the current block and the corresponding branches are calculated by means of the function GB( ) by taking account of the orientation data of the operation 500.

A loop is then launched which covers all the branches, and defines as full the points inside a space situated around each branch having a thickness of the radius r associated with the region of that branch.

For that, in an operation 525, an index i is initialized at 0 to cover the vector B derived from the operation 520, then, in an operation 530, a function Pnt( ) determines the locations which must be printed around the branch B[i], and commands the printer 6 accordingly.

Next, a test checks, in an operation 535, whether all the branches have been covered. If that is not the case, then the index i is incremented in an operation 540 and the loop resumes with the next branch. If that is the case, then the calculation is repeated for the next region with the operation 500.

Once all the layers Rg have been processed, the object 14 has been printed and the function stops with an operation 599.

As was seen above, the regions can be processed in parallel, and the function of FIG. 5 will be able to be modified accordingly. In addition, the function PN( ) of the function GB( ) is likely to go and select grains outside of the region Rg processed. By virtue of the deterministic nature of the selection of the grains, that nevertheless does not pose a problem of discontinuity at the boundaries of the regions, the content remaining strictly identical on either side. Furthermore, when a branch has been determined between two grains belonging to a first region Rg1 and a second region Rg2, and the region Rg1 is the object of a calculation before the region Rg2, it will no longer be necessary to repeat this calculation for this branch for the region Rg2.

FIG. 7 shows an example of application of the invention in the plane (2D) in which the object produced is deformed into a U shape when it is folded along an axis, and into a C shape when it is folded along another axis.

The functions GB( ) and SC( ) are therefore particularly advantageous because they make it possible to greatly reduce the quantity of information to be stored from one end to the other end of the line. Indeed, the orthotropic foams are fully defined by the field of tensors and their orientations.

Thus, from the production of the triplets to their consumption with a field of tensors for manufacturing the objects, a smaller number of parameters is sufficient to define the orthotropic foams of the invention. That makes it possible to save on a quantity of data that was previously unmanageable in the prior art, with a reasonable computation cost. Furthermore, it appears that the constructor 4, like the modeler 10, are each a generator of branch grains used to define whether locations are full or empty in a final object, whether it serves for a qualification of elasticity or in an object to be manufactured.

Finally, the proposed method makes it possible to generate a freely-orientable orthotropic elasticity in a part which is not possible with another method of the prior art.

The Applicant has studied the application of the invention to the various additive manufacturing methods and has validated the following elements:

For filament printing, the printing is possible with a variation of the elasticity on two axes only, the elasticity being homogeneous in the third direction, For powder printing, the thickness obtained for the branches can drop to 100 μm, and For powder printing, the thickness obtained for the branches can drop to 250 μm.

Many variants can be envisaged. Indeed, regarding the locations corresponding to a surface of the object, the processing can be complemented to render a "skin" or at least offer a regular surface (notwithstanding the holes). For that, it is possible to add an additional layer of material along the surface of the object, of chosen thickness, thus giving it a smooth appearance. Optionally, this layer can be partially openwork.

Likewise, when it is detected that a location q is close to two branches without being close enough given their radius, provision can nevertheless be made to print the corresponding location, in order to improve the strength at the branchings of the branches with one another. The creation of the triplets can be modified to take account of analyses of conformity of the elasticity. Finally, for aesthetic reasons, it is possible to use a lower density and a greater radius for a given elasticity, or any other choice to match a radius and a density to the chosen elasticity.

Another major advantage of the invention is that it makes it possible to produce objects whose rigidity is known with a weight much lower than in the conventional techniques, because the orthotropy makes it possible to better adapt to non-uniform stresses in the parts.

Although the example described above refers to additive manufacturing, the orthotropic foams of the invention could be produced differently, for example by molding or by extrusion.

The invention claimed is:

1. A data processing device for manufacturing foam, comprising a memory arranged to receive location data designating a location and a volume element containing this location, and a generator arranged to determine additive manufacturing data indicating if a location associated with the location data is empty or full, characterized in that:
   the memory is arranged to receive density data, deformation data and radius data, and in that
   the generator is arranged to calculate, for a given location designated by location data, branch grain data designating locations of branch grains of a set of branch grains associated with the given location,
   the generator is arranged to determine said branch grain locations in a plurality of volume elements comprising the volume element containing the given location on the one hand and volume elements selected in a vicinity of the volume element containing the given location on the other hand, each volume element receiving a number of branch grains drawn from density data associated with this volume element,
   the generator is also arranged to calculate a measurement between a first branch grain and a second branch grain from the distance between the location of the first branch grain on the one hand and the second branch grain on the other hand, by weighting this distance as a function of deformation data associated with the first branch grain and with the second branch grain,
   the generator is also arranged to select at least two branch grains for each branch grain, such that these at least two branch grains are the closest neighbors according to the measurement calculated by the generator, and
   the generator is also arranged to define manufacturing data indicating that a location is full when the distance between said location and its projection on one of the branches linking each branch grain to its closest neighbors is less than a distance drawn from the radius data, and in that the generator is a constructor arranged to construct the foam by linking to one another the branch grains.

2. The device as claimed in claim 1, wherein the generator is also arranged to calculate the measurement between a first branch grain and a second branch grain by weighting it as a function of a frame of reference associated with the deformation data.

3. The device as claimed in claim 1, wherein the generator is arranged to select the closest neighbors of a given branch grain from among a subset of branch grains which excludes the branch grains whose locations are situated at a distance from the location of the given branch grain greater than a threshold drawn from the deformation data and from the number of closest neighbors sought.

4. The device as claimed in claim 1, wherein the generator is arranged to allocate the branch grains in a deterministic manner within each volume element.

5. The device as claimed in claim 1, wherein the generator is arranged to determine said branch grain locations by dividing each volume element of the plurality of volume elements into one or more volume sub-elements, the number of which is calculated from the density data and from the volume of each volume element, by pseudo-randomly determining, as a function of the location data and of the density data, volume sub-elements receiving a branch grain, and by pseudo-randomly determining, in each volume sub-element receiving a branch grain, branch grain data designating a location in this volume sub-element.

6. The device as claimed in claim 1, wherein the generator is a modeler arranged to receive a triplet associating density data, deformation data and radius data, to determine a set of additive manufacturing data for an object of substantially cubic form from this pair, and to apply a homogenization method to draw a tensor datum therefrom.

7. The device as claimed in claim 6, wherein the modeler is arranged, for a given triplet, to determine several sets of additive manufacturing data by varying the pseudo-random determinations, and to produce an average of the tensor data for the given triplet.

8. The device as claimed in claim 1, wherein the constructor is arranged to receive object data defining the form of an object to be produced by additive manufacturing and comprising tensor data associated with locations designated by the object data, and, for at least some of the locations of the object data, to determine deformation data, frame-of-reference data, radius data and density data from the associated tensor data, and to determine corresponding additive manufacturing data.

9. A method for manufacturing an orthotropic foam, characterized in that it comprises the following operations:
receiving object data associating location data and tensor data, the tensor data being associated with density data, radius data and deformation data,
determining branch grain locations in a plurality of volume elements, the number of branch grains in a given volume element being determined from the density data associated with the locations of the given volume element,
for each branch grain, calculating a plurality of measurements between this branch grain as first branch grain on the one hand and a second branch grain on the other hand, the second branch grain being chosen for each measurement from among the other branch grains, the measurement being calculated from the distance between the location of the first branch grain on the one hand and the second branch grain on the other hand, by weighting this distance as a function of deformation data associated with the first branch grain and with the second branch grain,
selecting at least two branch grains for each branch grain, such that these at least two branch grains are the closest neighbors in the plurality of measurements calculated for each grain, and
defining manufacturing data indicating that a given location of a volume element is full when the distance between said given location and its projection on one of the branches linking each grain to its closest neighbors is less than a distance drawn from radius data, and
manufacturing a foam according to the defined full locations.

10. The method as claimed in claim 9, wherein the measurement between a first branch grain and a second branch grain is weighted as a function of a frame of reference associated with the deformation data.

11. The method as claimed in claim 9, wherein, to select the closest neighbors of a given branch grain, the plurality of measurements is calculated with a subset of branch grains which excludes the branch grains whose locations are situated at a distance from the location of the given branch grain greater than a threshold drawn from the deformation data and from the number of closest neighbors sought.

12. The method as claimed in claim 9, wherein said branch grain locations are determined deterministically.

13. The method as claimed in claim 9, wherein said branch grain locations are determined by dividing each volume element of the plurality of volume elements into one or more volume sub-elements, the number of which is calculated from the density data and from the volume of each volume element, by pseudo-randomly determining, as a function of the location data and of the density data, volume sub-elements receiving a branch grain and by pseudo-randomly determining, in each volume sub-element receiving a branch grain, branch grain data designating a location in this volume sub-element.

14. The method as claimed in claim 9, wherein the foam manufacturing operation is performed by additive manufacturing.

* * * * *